United States Patent [19]
Watanabe et al.

[11] Patent Number: 5,344,503
[45] Date of Patent: Sep. 6, 1994

[54] METHOD OF PREVENTING OXIDATION OF COPPER POWDER

[75] Inventors: Shizuharu Watanabe; Shuji Mushimoto, both of Kyoto, Japan

[73] Assignee: Murata Manufacturing Co., Ltd., Japan

[21] Appl. No.: 3,637

[22] Filed: Jan. 13, 1993

[30] Foreign Application Priority Data

Jan. 13, 1992 [JP] Japan ..................... 4-3789

[51] Int. Cl.$^5$ .................................. C23C 22/00
[52] U.S. Cl. .................. 148/248; 148/279; 148/269; 427/216
[58] Field of Search .............. 427/216; 148/269, 219, 148/248

[56] References Cited
FOREIGN PATENT DOCUMENTS
0155385 9/1982 Japan ........................ 148/

Primary Examiner—Sam Silverberg
Attorney, Agent, or Firm—Ostrolenk, Faber, Gerb & Soffen

[57] ABSTRACT

A method of preventing oxidation of copper powder which comprises the steps of:
  mixing copper powder, boric acid, and a solvent to form a mixture; and
  drying the mixture to evaporate the solvent,
  the boric acid being used in such an amount that the amount of boron atoms present in the copper powder after the drying step is from 0.01 to 0.1% by weight based on the weight of the copper powder,
  the solvent being selected from the group consisting of ketone solvents, hydrocarbon solvents and aromatic solvents, and being used in such an amount that the boric acid concentration of the mixture is not higher than the saturated concentration of boric acid.

9 Claims, 1 Drawing Sheet

METHOD OF PREVENTING OXIDATION OF COPPER POWDER

FIELD OF THE INVENTION

The present invention relates to a method of preventing oxidation of copper powder. Particularly, the present invention relates to a method of preventing oxidation of copper powder used for preparing an electrically conductive paste.

BACKGROUND OF THE INVENTION

In preparing an electrically conductive paste by a conventional technique, copper powder as an electrically conductive ingredient is dispersed along with a glass frit into an organic vehicle to prepare a paste. This electrically conductive paste is used to form electrically conductive circuit patterns. Such an electrically conductive circuit pattern is formed by a method in which the electrically conductive paste is first applied on a ceramic substrate by coating or printing, and the applied paste is dried and then baked in a non-oxidizing atmosphere such as nitrogen ($N_2$) or in a weakly oxidizing atmosphere containing oxygen ($O_2$) at a concentration of about 1,000 ppm or less.

It is important for electrically conductive pastes of this kind to inhibit the copper powder particles contained therein from undergoing oxidation. This is because if oxidation of the copper powder particles proceeds, the electrically conductive paste comes to have poor printing properties or the paste after baking has an increased specific resistance and impaired solderability. In order to avoid occurrence of such troubles, a technique of subjecting beforehand copper powder to an oxidation preventing treatment is employed. As one of such oxidation preventing treatment, a method has been employed, in which copper powder is immersed in a boric acid-containing solution, followed by mixing with stirring, and the copper powder particles are then filtered off and subjected to heating treatment at a temperature of from 50° to 260° C. to form a boric acid layer covering the surface of the copper powder particles. In preparing the boric acid-containing solution, an alcohol solvent, e.g., methanol, has been generally employed, because of its high ability of dissolving boric acid.

However, the conventional oxidation preventing method described above has a problem in that, in the case where a boric acid-containing solution used in the above method is prepared using an alcohol solvent in which boric acid has a high solubility, a volatile ester is formed between the alcohol solvent and boric acid, and the boric acid also evaporates during the mixing treatment with stirring and during the heating treatment. As a result, the oxidation prevention effect of boric acid becomes insufficient.

SUMMARY OF THE INVENTION

An object of the present invention is to provide a method of preventing oxidation of copper powder in which the aforementioned problem is avoided to attain excellent oxidation prevention effect.

Other objects and effects of the present invention will be apparent from the following description.

The present invention relates to a method of preventing oxidation of copper powder which comprises the steps of:

mixing copper powder, boric acid, and a solvent to form a mixture; and drying the mixture to evaporate the solvent, in which the boric acid is used in such an amount that the amount of boron atoms present in the copper powder after the drying step is from 0.01 to 0.1% by weight based on the weight of the copper powder, and the solvent is selected from the group consisting of ketone solvents, hydrocarbon solvents and aromatic solvents, and is used in such an amount that the boric acid concentration of the mixture is not higher than the saturated concentration of boric acid.

DETAILED DESCRIPTION OF THE INVENTION

Figure 1:
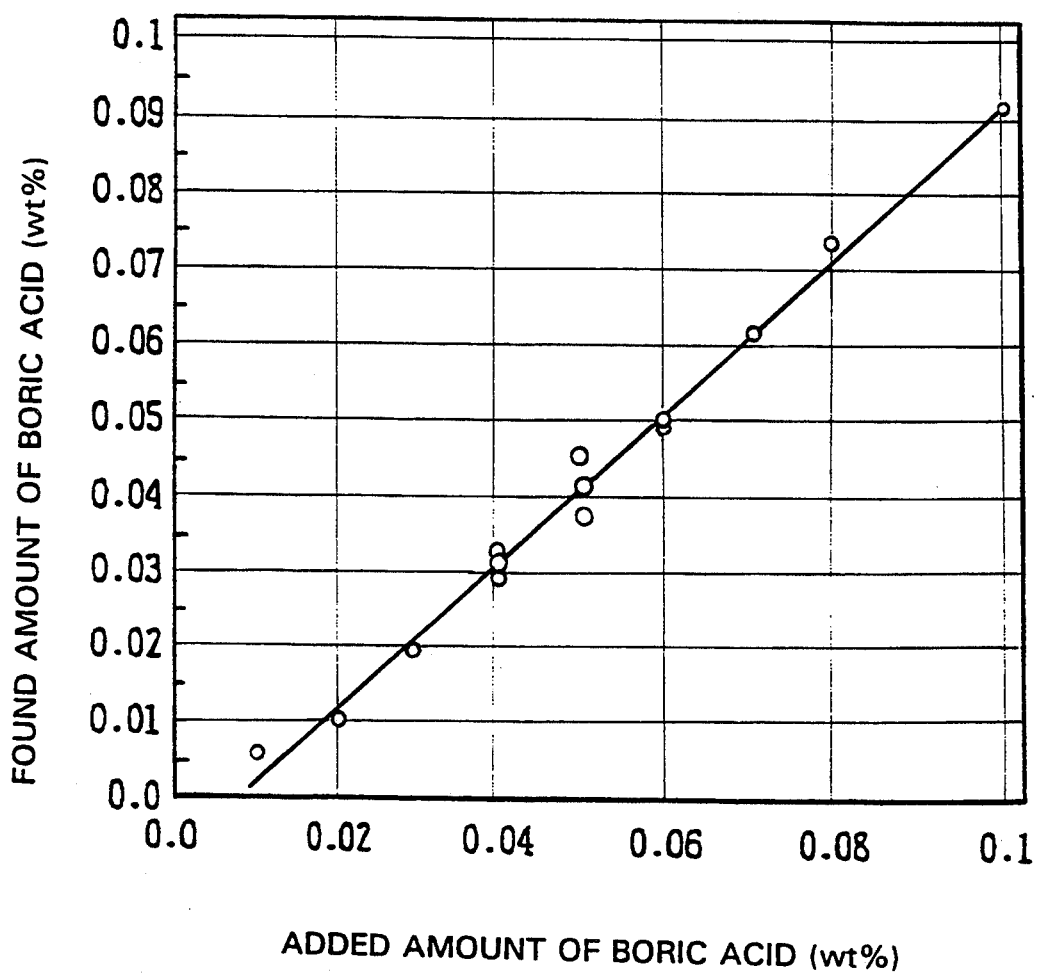
FIG. 1 is a graph showing the relationship between the added amount of boric acid and the amount of boric acid found in the copper powder after being subjected to the method of the present invention. The amounts of boric acid are represented in terms of the boron atom content.

According to the present invention, copper powder used as an electrically conductive ingredient is first subjected to the oxidation preventing treatment, prior to the preparation of an electrically conductive paste. The oxidation preventing treatment is conducted in such a manner that the copper powder is mixed with boric acid and a solvent selected from ketone solvents, hydrocarbon solvents and aromatic solvents, to form a mixture, and the mixture is then dried to evaporate the solvent only.

Upon preparing the mixture, the boric acid is used in such an amount that the amount of boron atoms present in the copper powder after the drying step, i.e., the final product, is from 0.01 to 0.1% by weight based on the weight of the copper powder.

The amount of the boric acid added to the mixture that corresponds to the above-mentioned boron atom content in the final product can be easily determined by experiments, because substantially the whole amount of the added boric acid is generally remained in the final product of the present invention, and also the relationship between the added boron amount and that found in the final product is linear and shows excellent reproducibility. For example, FIG. 1 shows the relationship between the added amount of boric acid and the amount of boric acid found in the final product of the method of the present invention. The amounts of boric acid are represented in terms of the boron atom content.

The solvent used in the present invention is not particularly limited as long as the solvent is a ketone solvent, a hydrocarbon solvent or an aromatic solvent. Examples of the ketone solvent include acetone, methyl ethyl ketone, and diethyl ketone. Examples of the hydrocarbon solvent include pentane, hexane, and heptane. Examples of the aromatic solvent include benzene, xylene, and toluene. Among the above solvents, acetone is preferably used in the present invention.

The solvent is used in such an amount that the boric acid concentration of the mixture is not higher than the saturated concentration of boric acid, preferably from 10 to 80% of the saturated concentration, and more preferably from 40 to 60% of the saturated concentration.

The copper powder used in the present invention is not particularly limited, and conventional copper powder used for preparing electrically conductive pastes, which generally have a diameter of from 1 to 5 μm, can be used.

The mixing of copper powder, boric acid, and the solvent can be conducted in any conventional manner, and preferably, the mixing is conducted in a mixer provided with stirring blades for from 15 to 60 minutes at a rotation number of the blades of from 5 to 20 rpm.

The conditions for the drying treatment of the mixture are not particularly limited. When the drying treatment is conducted in the air, the upper limit of the temperature is preferably about 260° C., since temperatures exceeding 260° C. tend to accelerate the oxidation of the copper powder itself. The drying treatment may be performed under reduced pressure or alternatively at higher temperatures if the pressure is high. The drying treatment is preferably performed under a pressure of from 5 KPa to 1 MPa at the boiling point of the solvent at that pressure.

In order to prevent segregation of boric acid the drying treatment is preferably performed by using a mixer provided with a stirring blades, as well as a heating means (e.g., a heating jacket) and an evacuation means.

The mixing and drying can be conducted continuously in a mixer provided with a stirring blades, a heating means and an evacuation means.

Table 1 summarizes the solubilities of boric acid in various solvents and the boiling points of the solvents and their esters with boric acid. It is understood from Table 1 that the use of the alcohol solvents having an OH group in the molecule attains high solubilities of boric acid but results in formation of volatile esters. On the other hand, the use of ketone solvents, hydrocarbon solvents or aromatic solvents does not result in formation of an ester with boric acid. For example, as shown in Table 1, acetone which is a ketone solvent does not result in formation of an ester although the solubility of boric acid is relatively low.

In Table 1, MeOH denotes methanol, $_{95}$EtOH ethanol, i-PrOH isopropyl alcohol, i-AmOH isoamyl alcohol, EG ethylene glycol, and Me$_2$CO acetone. With respect to the solubility in i-PrOH, it has been experimentally ascertained that the solubility is at least 5 wt %.

TABLE 1

Solubilities of Boric Acid in Various Solvents and Boiling Points of the Solvents and Esters

| Solvent | Solubility* | Boiling point (°C.) | Ester boiling point (°C.) |
|---|---|---|---|
| MeOH | 23 s'v | 64.5 | 55–56 |
| $_{95}$EtOH | 8 s' | 82.3 | 118.6 |
| i-PrOH | ≧5 s | 82.3 | unknown |
| i-AmOH | 3.92 s' | 131.4 | unknown |
| EG | 22.2 s' | 197.9 | unknown |
| Me$_2$CO | 1.25 s' | 56.2 | — |

Note:
*s'v: Amount of the solute (g) contained in 1,000 ml of saturated soltuion.
s': Amount of the solute (g) contained in 100 g of saturated solution.
s: Maximum amount (g) of the solute that can be dissolved in 100 g of solvent.

In the conventional methods, alcohol solvents are used because of their high solubility with respect to boric acid. However, boric acid forms volatile esters of low boiling points with the alcohol solvents, and the esters will evaporate during the mixing and the heating treatment for drying. As a result, a problem arises in that the oxidation prevention effect of boric acid becomes insufficient. On the other hand, according to the method of the present invention, since no volatile ester is formed by mixing boric acid and the solvent, evaporation of the solvent only through mixing and drying results in copper powder particles having boric acid remains unevaporated on their surface.

The present invention will be described in more detail with reference to the following example, but the present invention is not construed as being limited thereto.

EXAMPLE 100 g of copper powder having a particle diameter of about from 1 to 5 μm, boric acid in a predetermined amount shown in Table 2 below, and acetone as a ketone solvent in such an amount as to result in a boric acid concentration of 0.5 wt %, which is about ½ of the saturated concentration of boric acid were mixed with each other and stirred over a period of 1 hour, so as to obtain a mixture composition. In the composition, the copper powder had a mixture of boric acid and the solvent adhered on the surface of powder particles.

Thereafter, the mixture composition thus obtained was subjected to drying treatment under a reduced pressure at a temperature of 50° C., thereby to evaporate the solvent acetone only, so as to prepare treated copper powder (Samples 1 to 8). The boric acid remained unevaporated on the surface of the copper powder particles, and the surface of the copper powder particles were covered with a boric acid layer.

Separately, the above procedures were repeated except that isopropanol, as an alcohol solvent, was used instead of the acetone to prepare treated copper powder (Samples 9 to 11).

The boron amount in the treated copper powder was determined in such a manner that the treated copper powder was dissolved in nitric acid, and the solution obtained was subjected to a quantitative determination by an inductively coupled plasma (ICP) method.

The boron amount added to the mixture composition and the boron amount found in the treated copper powder thus obtained for each sample are shown in Table 2.

In the case of pastes containing copper powder prepared using acetone as a solvent, the relationship between the added boron amount and that found in the treated copper powder was linear and showed excellent reproducibility, as shown in FIG. 1.

In order to ascertain the effects of the method of the present invention, electrically conductive pastes were prepared using the above produced copper powder (Samples 1 to 11), and the degree of the progress of copper powder oxidation in each of electrically conductive pastes prepared using the copper powder was evaluated based on the solderability and strength for the paste.

80 g of each the above prepared copper powder was thoroughly mixed with 7 g of a lead borosilicate glass frit and 13 g of an organic vehicle obtained by dissolving ethyl cellulose in α-terpineol, thereby to provide pastes.

Each of the thus-obtained electrically conductive pastes was printed on an alumina substrate and dried at a temperature of 150° C. for 10 minutes. The dried pastes were then baked by baking according to the same temperature pattern in which the maximum temperature was 600° C. (10 minutes) with the total baking time being 60 minutes. The atmosphere for the baking was a weakly oxidizing atmosphere regulated to have an O$_2$ concentration of from 100 to 900 ppm.

Thereafter, each of the thus-baked various electrically conductive pastes was evaluated for solderability and strength by the following manners:

(a) Solderability

A copper electrode sample having a dimension of 2×2 mm obtained from the electrically conductive paste was immersed in a soldering bath (Pb/Sn ratio: 4/6, containing 2 wt % of Ag) at 235° C. for 5 seconds, and the surface of the electrode was observed. Samples where 90% or more of the surface of the electrode was covered with solder were graded "good", and samples where less than 90% of the surface was covered with solder were graded "poor".

(b) Strength

An L-shaped solder-plated soft copper wire was soldered on a copper electrode obtained from the electrically conductive paste. The wire was subjected to a tensile test at a pulling rate of 20 mm/min by using an autograph manufactured by Shimadzu Corp. The tensile strength of 10 N or more was graded "good", and that of less than 10 N was graded "poor". Cases where the wire could not be soldered on the copper electrode were graded "unmeasurable".

The results obtained are summarized in Table 2.

TABLE 2

| Sample | Added boron amount** (wt %) | Found boron amount** (wt %) | Solderability | Strength |
| --- | --- | --- | --- | --- |
| 1* | 0.01 | 0.006 | poor | good |
| 2 | 0.02 | 0.010 | good | good |
| 3 | 0.03 | 0.020 | good | good |
| 4 | 0.04 | 0.034 | good | good |
| 5 | 0.05 | 0.042 | good | good |
| 6 | 0.07 | 0.063 | good | good |
| 7 | 0.10 | 0.091 | good | good |
| 8* | 0.11 | 0.104 | good | poor |
| 9* | 0.03 | not detected | poor | unmeasurable |
| 10* | 0.04 | not detected | poor | unmeasurable |
| 11* | 0.05 | not detected | poor | unmeasurable |

Note:
*Samples 1 and 8 to 11 are comparative samples.
**The boron amount is shown in terms of weight percentage of boron atoms based on the amount of copper powder.

It is understood from the results shown in Table 2 that Samples 9 to 11 treated by the conventional method provide poor solderability because the treatment results in formation of a volatile ester and causes the boric acid also to evaporate, whereas Samples 2 to 7 treated according to the method of the present invention provide good solderability, indicating that boric acid is adhered to the surface of the copper powder particles in an amount necessary to oxidation prevention, and a sufficient oxidation preventing effect can be exhibited. Further, it is also understood that even though copper powder is treated in the same manner as in the method of the present invention, sufficient oxidation preventing effect cannot be obtained if the boron amount is outside the range of the present invention. Specifically, Sample 1 in which the found boron amount was less than 0.01 wt % was inferior in solderability, and Sample 8 in which the found boron amount was more than 0.1 wt % was inferior in strength.

It should be noted that although acetone, a ketone solvent, is exemplified as the solvent to be mixed with the copper powder and boric acid in the example explained above, the solvent for use in the present invention is not limited to such a ketone solvent, and other ketone solvents, hydrocarbon solvents and aromatic solvents should provide the same results because any volatile ester is not formed.

As described above, according to the method of the present invention for preventing oxidation of a copper powder, formation of a boric acid film covering the surface of the copper powder particles is ensured and an excellent oxidation preventing effect is obtained. In addition, there also is another effect that an improvement in reproducibility of the relationship between the added boron amount and the found boron amount can be attained, since the substantially the whole amount of boric acid as added adheres to the copper powder particles.

While the invention has been described in detail and with reference to specific embodiments thereof, it will be apparent to one skilled in the art that various changes and modifications can be made therein without departing from the spirit and scope thereof.

What is claimed is:

1. A method of preventing oxidation of copper powder which comprises the steps of:
   mixing copper powder, boric acid, and a solvent to form a mixture; and
   drying said mixture to evaporate said solvent,
   said boric acid being used in such an amount that the amount of boron atoms present in said copper powder after said drying step is from 0.01 to 0.1% by weight based on the weight of said copper powder,
   said solvent being selected from the group consisting of ketone solvents, hydrocarbon solvents and aromatic solvents, and being used in such an amount that the boric acid concentration of said mixture is not higher than the saturated concentration of boric acid.

2. A method as claimed in claim 1, wherein said drying step is conducted at a temperature of 260° C. or less.

3. A method as claimed in claim 1, wherein said solvent is a ketone solvent.

4. A method as claimed in claim 3, wherein said ketone solvent is selected from the group consisting of acetone, methyl ethyl ketone, and diethyle ketone.

5. A method as claimed in claim 4, wherein said ketone solvent is acetone.

6. A method as claimed in claim 1, wherein said solvent is a hydrocarbon solvent.

7. A method as claimed in claim 6, wherein said hydrocarbon solvent is selected from the group consisting of pentane, hexane, and heptane.

8. A method as claimed in claim 1, wherein said solvent is an aromatic solvent.

9. A method as claimed in claim 8, wherein said aromatic solvent is selected from the group consisting of benzene, xylene, and toluene.

* * * * *